(12) United States Patent
Nakanishi

(10) Patent No.: US 11,271,496 B2
(45) Date of Patent: Mar. 8, 2022

(54) PIEZOELECTRIC DRIVE DEVICE AND ROBOT

(71) Applicant: Seiko Epson Corporation, Tokyo (JP)

(72) Inventor: Daisuke Nakanishi, Azumino (JP)

(73) Assignee: Seiko Epson Corporation

( * ) Notice: Subject to any disclaimer, the term of this patent is extended or adjusted under 35 U.S.C. 154(b) by 8 days.

(21) Appl. No.: 17/002,919

(22) Filed: Aug. 26, 2020

(65) Prior Publication Data

US 2021/0067061 A1    Mar. 4, 2021

(30) Foreign Application Priority Data

Aug. 27, 2019  (JP) .............................. JP2019-154404

(51) Int. Cl.

| | |
|---|---|
| *H02N 2/12* | (2006.01) |
| *H01L 41/053* | (2006.01) |
| *H02N 2/00* | (2006.01) |
| *H02N 2/14* | (2006.01) |
| *B25J 18/00* | (2006.01) |
| *H02N 2/10* | (2006.01) |
| *B25J 9/12* | (2006.01) |

(52) U.S. Cl.
CPC .................. *H02N 2/12* (2013.01); *B25J 9/12* (2013.01); *B25J 18/00* (2013.01); *H01L 41/053* (2013.01); *H01L 41/0536* (2013.01); *H02N 2/001* (2013.01); *H02N 2/004* (2013.01); *H02N 2/006* (2013.01); *H02N 2/0065* (2013.01); *H02N 2/103* (2013.01); *H02N 2/14* (2013.01)

(58) Field of Classification Search
CPC .......... H02N 2/12; H02N 2/004; H02N 2/006; H02N 2/0065; H02N 2/103; H02N 2/001; H02N 2/14; H01L 41/053; H01L 41/0536; B25J 9/12; B25J 18/00
See application file for complete search history.

(56) References Cited

U.S. PATENT DOCUMENTS

| | | |
|---|---|---|
| 5,453,653 A | 9/1995 | Zumeris |
| 6,211,603 B1 | 4/2001 | Iino et al. |

(Continued)

FOREIGN PATENT DOCUMENTS

| | | |
|---|---|---|
| JP | H07-184382 A | 7/1995 |
| JP | H10-327589 A | 12/1998 |

(Continued)

*Primary Examiner* — Emily P Pham
(74) *Attorney, Agent, or Firm* — Harness, Dickey & Pierce, P.L.C.

(57) ABSTRACT

A piezoelectric drive device includes a vibrating part which has a piezoelectric element, and drives a driven part using the piezoelectric element, and a first plate spring part configured to bias the vibrating part in a first direction from the vibrating part toward the driven part. The first plate spring part extends toward a second direction crossing the first direction, the first plate spring part is disposed so as to be opposed to the vibrating part in a third direction perpendicular to the first direction and the second direction, and when dividing the first plate spring part into a first portion and a second portion farther from the vibrating part than the first portion so that a length along the third direction is equally divided, a volume of the second portion is larger than a volume of the first portion.

6 Claims, 15 Drawing Sheets

(56) References Cited

U.S. PATENT DOCUMENTS

| | | | | |
|---|---|---|---|---|
| 2007/0038316 A1* | 2/2007 | Ichikawa | ............ | G02B 27/646 |
| | | | | 700/66 |
| 2019/0273450 A1* | 9/2019 | Wischnewskiy | ....... | H02N 2/026 |
| 2020/0075835 A1* | 3/2020 | Kajino | .................. | H02N 2/103 |
| 2020/0112272 A1* | 4/2020 | Shihoh | ................... | H02N 2/103 |
| 2021/0058010 A1* | 2/2021 | Iwazaki | ................ | H01L 41/042 |

FOREIGN PATENT DOCUMENTS

| JP | 2001-292584 A | 10/2001 |
|---|---|---|
| JP | 2012-235622 A | 11/2012 |
| JP | 2013-121213 A | 6/2013 |
| JP | 2016-040988 A | 3/2016 |

\* cited by examiner

PIEZOELECTRIC DRIVE DEVICE AND ROBOT

The present application is based on, and claims priority from JP Application Serial Number 2019-154404, filed Aug. 27, 2019, the disclosure of which is hereby incorporated by reference herein in its entirety.

BACKGROUND

1. Technical Field

The present disclosure relates to a piezoelectric drive device and a robot.

2. Related Art

In JP-A-2001-292584, there is described a device provided with a vibrating body which uses a deformation of a piezoelectric element to make an elliptical motion, a movable body driven by contact with the vibrating body, and a spring member shaped like a plate for biasing the vibrating body toward the movable body.

In the device described above, there is a possibility that the position of the vibrating body is shifted in an unintended direction due to a deflection or a contortion of the spring member, to make it unachievable to efficiently transmit a drive force from the vibrating body to the movable body.

SUMMARY

According to an aspect of the present disclosure, there is provided a piezoelectric drive device. The piezoelectric drive device includes a vibrating part which has a piezoelectric element, and drives a driven part using the piezoelectric element, and a first plate spring part configured to bias the vibrating part in a first direction from the vibrating part toward the driven part. The first plate spring part extends toward a second direction crossing the first direction, the first plate spring part is disposed so as to be opposed to the vibrating part in a third direction perpendicular to the first direction and the second direction, and when dividing the first plate spring part into a first portion and a second portion farther from the vibrating part than the first portion so that a length along the third direction is equally divided, a volume of the second portion is larger than a volume of the first portion.

DESCRIPTION OF EXEMPLARY EMBODIMENTS

A. First Embodiment

Figure 1:
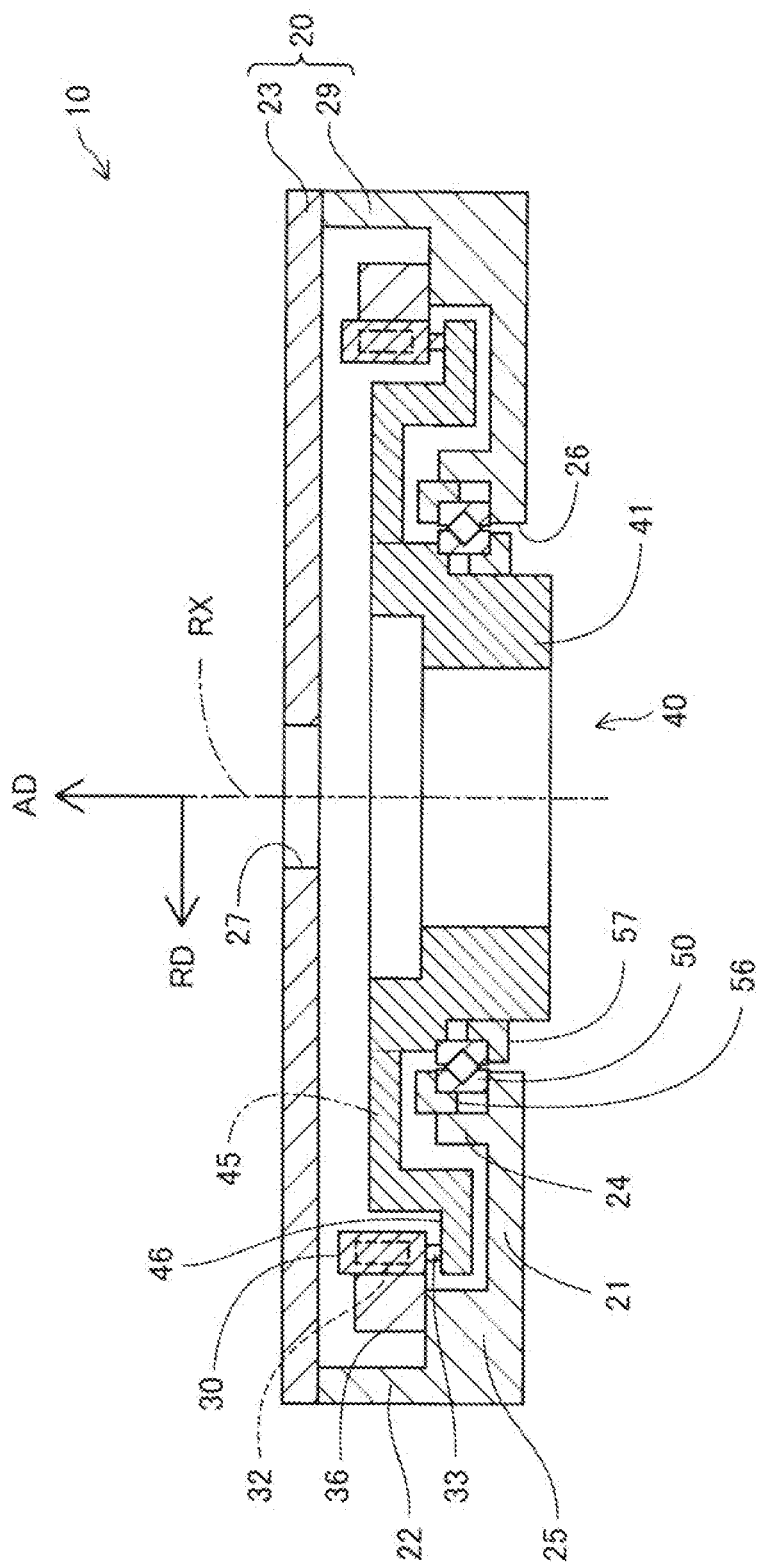
FIG. 1 is a first explanatory diagram showing a schematic configuration of a piezoelectric motor according to a first embodiment.
Figure 2:
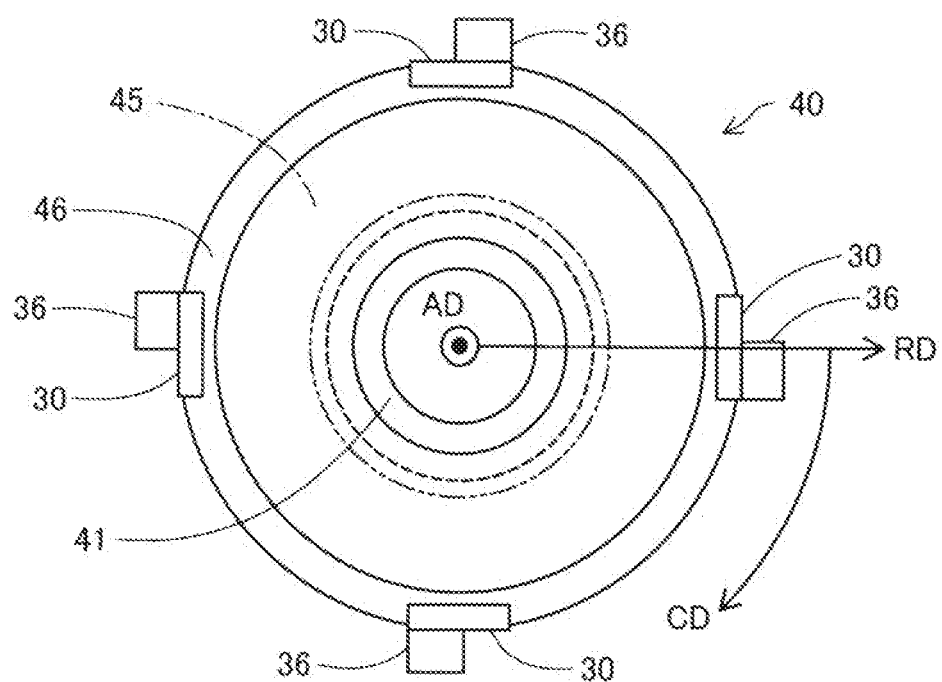
FIG. 2 is a second explanatory diagram showing a schematic configuration of the piezoelectric motor according to the first embodiment.

FIG. 1 is a first explanatory diagram showing a schematic configuration of a piezoelectric motor 10 in a first embodiment. FIG. 2 is a second explanatory diagram showing a schematic configuration of the piezoelectric motor 10 in the first embodiment. The piezoelectric motor 10 in the present embodiment is provided with a case 20 which zones an outer shape of the piezoelectric motor 10, piezoelectric actuators 30 housed inside the case 20, a rotor 40 driven by the piezoelectric actuators 30, and a bearing 50 for rotatably supporting the rotor 40. The piezoelectric actuators 30 are each provided with piezoelectric elements 32, and rotate the rotor 40 using two-dimensional deformation of the piezoelectric element 32. The rotation of the rotor 40 is transmitted to the outside of the piezoelectric motor 10 via an output section 41. The piezoelectric motor 10 can also be provided with an encoder for detecting a rotational direction, a rotational angle, and rotational speed of the rotor 40 with respect to the case 20. The encoder can be an optical encoder, or can also be a magnetic encoder. It should be noted that the piezoelectric motor 10 is referred to as an ultrasonic motor in some cases. The piezoelectric actuators 30 are each referred to as a piezoelectric drive device in some cases. The rotor 40 is referred to as a driven part in some cases.

The case 20 is constituted by a lower case 29 and a lid part 23. The lower case 29 is provided with a bottom surface part 21, and a side surface part 22 disposed so as to stand from an outer circumferential edge of the bottom surface part 21 toward the lid part 23. At the center of the bottom surface part 21, there is disposed an opening part 26 through which the output section 41 penetrates. On the outer periphery of the opening part 26 of the bottom surface part 21, there is disposed a protruding part 24 to which an outer race of the bearing 50 is coupled. Inside the outer circumferential edge of the bottom surface part 21, there is disposed a step part 25 to which the piezoelectric actuators 30 are coupled. Coupling of the bearing 50 and the piezoelectric actuators 30 will be described later. The lid part 23 is coupled to an upper end portion of the side surface part 22 of the lower case 29 with screws after the bearing 50, the rotor 40, and the piezoelectric actuators 30 are coupled to the lower case 29. The lid part 23 is provided with a through hole 27 through which wiring or the like passes.

The piezoelectric actuators 30 are each fixed to the step part 25 of the case 20 via a fixation member 36. The piezoelectric actuators 30 are each provided with the piezoelectric elements 32 described above and a tip part 33 opposed to a contacted surface 46 of the rotor 40. By supplying the piezoelectric elements 32 with AC currents, the piezoelectric elements 32 deform to cause the tip part 33 to vibrate so as to draw an elliptical orbit. Due to the vibration, the tip part 33 repeatedly touches the contacted surface 46 of the rotor 40 to apply a drive force to the rotor 40. In the present embodiment, the piezoelectric actuators 30 are fixed to the fixation member 36 with screws. The fixation member 36 is fixed to the step part 25 with at least either one of screws and an adhesive. It should be noted that a specific configuration and an operation of the piezoelectric actuators 30 will be described later.

In FIG. 2, there is shown a positional relationship between the piezoelectric actuators 30 and the rotor 40 viewed from the lid part 23 toward the bottom surface part 21. The piezoelectric motor 10 in the present embodiment is provided with four piezoelectric actuators 30. The four piezoelectric actuators 30 are disposed at regular intervals. It should be noted that the number of the piezoelectric actuators 30 provided to the piezoelectric motor 10 is not limited to four, but can be in a range from one through three, or can also be not smaller than five. The piezoelectric actuators 30 are not required to be disposed at regular intervals.

The rotor 40 has the output section 41 described above, and a transmission section 45 disposed on the outer periphery of the output section 41 and coupled to the output section 41. In the present embodiment, the rotor 40 rotates around a rotational axis RX. The rotor 40 has the output section 41 as a hollow. It should be noted that it is possible for the rotor 40 to have the output section 41 as a solid body. A direction from the lower case 29 toward the lid part 23 along the rotational axis RX of the output section 41 of the rotor 40 is referred to as an axial direction AD, and a direction from the rotational axis RX toward the outside and perpendicular to the rotational axis RX of the output section 41 is referred to as a radial direction RD. Further, the rotational direction of the rotor 40 is referred to as a circumferential direction CD. These directions AD, RD, and CD are arbitrarily illustrated in each of the drawings.

The transmission section 45 receives a drive force from the tip part 33 of each of the piezoelectric actuators 30, and then transmits the drive force to the output section 41. In the present embodiment, the transmission section 45 has a flexed shape. Specifically, the transmission section 45 has a shape obtained by sequentially coupling a circular ring-like portion extending from the output section 41 toward the outside in the radial direction RD, a circular cylindrical portion extending from the circular ring-like portion toward the bottom surface part 21 of the case 20, and a circular ring-like portion extending from the circular cylindrical portion toward the outside in the radial direction RD. On a surface opposed to the lid part 23 of the case 20 in the transmission section 45, there is disposed a contacted surface 46 with which the tip parts 33 of the piezoelectric actuators 30 make contact. The contacted surface 46 is disposed between both ends of the rotor 40 in the axial direction AD. Therefore, it is possible to reduce the piezoelectric motor 10 in size in a direction along the axial direction AD.

In the present embodiment, the transmission section 45 is formed integrally with the output section 41. In FIG. 1 and FIG. 2, a boundary between the transmission section 45 and the output section 41 is represented by a dashed-two dotted line. The transmission section 45 can be formed as a separated body from the output section 41. In this case, the transmission section 45 and the output section 41 formed as the separated bodies are fixed to each other with screws, welding, an adhesive, or the like. It should be noted that the boundary between the transmission section 45 and the output section 41 shown in FIG. 1 and FIG. 2 is drawn for the sake of convenience of explanation, and can arbitrarily be set in view of the function of each of the constituents.

In the present embodiment, the rotor 40 is formed of an aluminum alloy. The rotor can be formed of another metal material such as stainless steel or a titanium alloy, or can also be formed of a ceramic material or a resin material instead of the aluminum alloy. On the contacted surface 46 of the rotor 40, there can be disposed a surface treatment layer such as an alumina layer, a zirconia layer, or a barium titanate layer. By disposing the surface treatment layer on the contacted surface 46, it is possible to suppress the abrasion of the contacted surface 46 due to the contact with the tip parts 33.

The bearing 50 is disposed between the output section 41 of the rotor 40 and the protruding part 24 of the case 20. The bearing 50 rotatably supports the rotor 40 to the case 20. In the present embodiment, as the bearing 50, there is used a roller bearing having a circular ring shape centering on the rotational axis RX. The bearing 50 can be, for example, a ball bearing instead of the roller bearing. By the bearing 50 supporting the rotor 40, the rotor 40 can smoothly rotate around the rotational axis RX.

The outer race of the bearing 50 is clamped by a first support member 56 and the bottom surface part 21 of the case 20. The first support member 56 has a circular ring shape centering on the rotational axis RX. A cross-sectional surface of the first support member 56 perpendicular to the circumferential direction CD has an L-shape. In the present embodiment, screw parts are provided to each of the outer circumferential side surface of the first support member 56 and the inner circumferential side surface of the protruding part 24 of the case 20, and by making the screw parts fit in each other, the first support member 56 is fixed to the protruding part 24.

The inner race of the bearing 50 is clamped by a second support member 57 and the output section 41 of the rotor 40. The second support member 57 has a circular ring shape centering on the rotational axis RX. A cross-sectional surface of the second support member 57 perpendicular to the circumferential direction CD has an L-shape obtained by rotating the cross-sectional surface of the first support member 56 as much as 180 degrees. In the present embodiment, screw parts are provided to each of the outer circumferential side surface of the output section 41 of the rotor 40 and the inner circumferential side surface of the second support member 57, and by making the screw parts fit in each other, the second support member 57 is fixed to the rotor 40.

After the rotor 40 is rotatably coupled to the lower case 29 using the bearing 50, the first support member 56, and the second support member 57 as shown in FIG. 1, the fixation member 36 to which the piezoelectric actuators 30 are coupled in advance is coupled to the lower case 29 as shown in FIG. 2.

Figure 3:
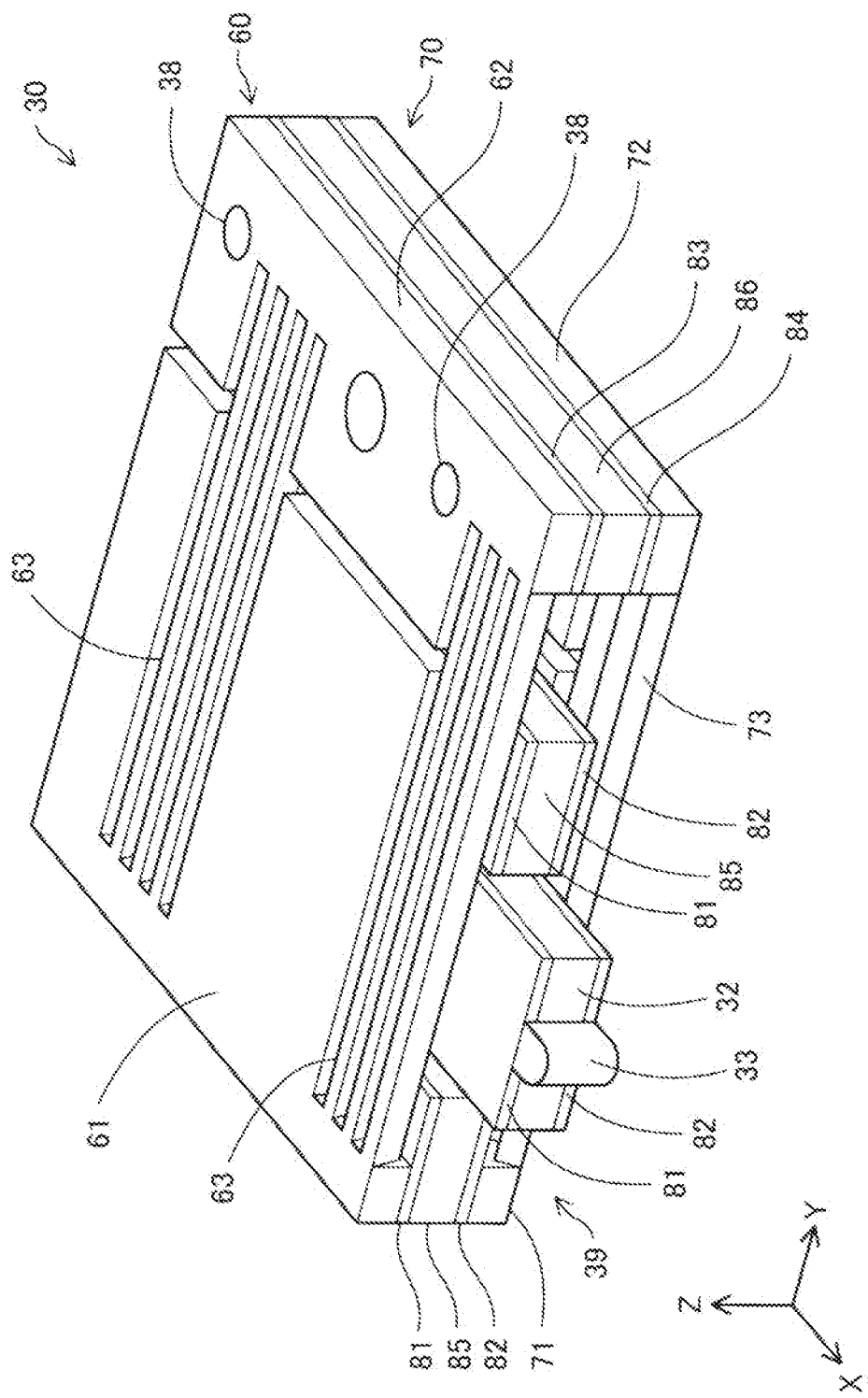
FIG. 3 is a perspective view showing a configuration of a piezoelectric actuator in the first embodiment.

FIG. 3 is a perspective view showing a configuration of each of the piezoelectric actuators 30. In FIG. 3, there are shown the arrows along X, Y, and Z directions perpendicular to each other, respectively. The X direction is a direction parallel to the axial direction AD shown in FIG. 1 and FIG. 2, and the Z direction is a direction parallel to the radial direction RD shown in FIG. 1 and FIG. 2. These directions X, Y, and Z are arbitrarily illustrated in each of the drawings. The piezoelectric actuator 30 is provided with a main body part 39 having the piezoelectric elements 32, the tip part 33 coupled to the main body part 39, a first parallel spring part 60 for biasing the main body part 39 toward the rotor 40, and a second parallel spring part 70 for biasing the main body part 39 toward the rotor 40 together with the first parallel spring part 60.

The main body part 39 is disposed between the first parallel spring part 60 and the second parallel spring part 70. The main body part 39 is constituted by the piezoelectric elements 32, a first vibrating plate 81, a second vibrating plate 82, and a first interlayer member 85. The piezoelectric elements 32 are disposed between the first vibrating plate 81 and the second vibrating plate 82. The first interlayer member 85 is disposed so as to fill a gap between the first vibrating plate 81 and the second vibrating plate 82.

The piezoelectric elements 32 are each formed of a piezoelectric body provided with electrodes disposed on both surfaces. In the present embodiment, the piezoelectric body is formed of lead zirconate titanate. The piezoelectric body can be formed of, for example, barium titanate or quartz crystal instead of lead zirconate titanate. The electrodes are coupled to a power supply via a switching element with interconnections not shown.

The first vibrating plate 81 and the second vibrating plate 82 have the same shape. The first vibrating plate 81 and the second vibrating plate 82 are formed of silicon. With an adhesive having an insulation property, the piezoelectric elements 32 and the first vibrating plate 81 are bonded to each other, and the piezoelectric elements and the second vibrating plate 82 are bonded to each other. The first interlayer member 85 is formed of silicon. With an adhesive having an insulation property, the first interlayer member 85 and the first vibrating plate 81 are bonded to each other, and the first interlayer member 85 and the second vibrating plate 82 are bonded to each other.

The tip part 33 is bonded to the main body part 39 with an adhesive having an insulation property. The tip part 33 is preferably formed of a material superior in abrasion resistance. In the present embodiment, the tip part 33 is formed of alumina.

The first parallel spring part 60 has a first non-spring part 61, a second non-spring part 62, and a plurality of first plate spring parts 63 for coupling the first non-spring part 61 and the second non-spring part 62 to each other. In the present embodiment, the first non-spring part 61 and the second non-spring part 62 are coupled to each other with the six first plate spring parts 63. The number of the first plate spring parts 63 provided to the first parallel spring part 60 is not limited to six, but can be in a range from two to five, and can also be seven or more. The first non-spring part 61 and the second non-spring part 62 are each a part hard to deform along the X direction in the first parallel spring part 60. The first plate spring parts 63 are each a part easy to deform along the X direction in the first parallel spring part 60. The first plate spring parts 63 extend in parallel to each other toward the Y direction. The first plate spring parts 63 are disposed so as to be opposed to the main body part 39 in the Z direction. The first parallel spring part 60 biases the main body part 39 with elastic energy stored in the first plate spring parts 63.

The second parallel spring part 70 has a third non-spring part 71, a fourth non-spring part 72, and a plurality of second plate spring parts 73 for coupling the third non-spring part 71 and the fourth non-spring part 72 to each other. In the present embodiment, the third non-spring part 71 and the fourth non-spring part 72 are coupled to each other with the six second plate spring parts 73. The number of the second plate spring parts 73 provided to the second parallel spring part 70 is not limited to six, but can be in a range from two to five, and can also be seven or more. The third non-spring part 71 and the fourth non-spring part 72 are each a part hard to deform along the X direction in the second parallel spring part 70. The second plate spring parts 73 are each a part easy to deform along the X direction in the second parallel spring part 70. The second plate spring parts 73 extend in parallel to each other toward the Y direction. The second plate spring parts 73 are disposed so as to be opposed to the main body part in the Z direction. In the present embodiment, the second parallel spring part 70 has a symmetrical shape with the first parallel spring part 60 across the main body part 39. The second parallel spring part 70 biases the main body part 39 with elastic energy stored in the second plate spring parts 73.

The first parallel spring part 60 and the second parallel spring part 70 are each formed of silicon. The first non-spring part 61, the second non-spring part 62, and the first plate spring parts 63 in the first parallel spring part 60 can be formed using dry etching on silicon shaped like a plate. The third non-spring part 71, the fourth non-spring part 72, and the second plate spring parts 73 in the second parallel spring part 70 can be formed using dry etching on silicon shaped like a plate.

Between the second non-spring part 62 of the first parallel spring part 60 and the fourth non-spring part 72 of the second parallel spring part 70, there are disposed a third vibrating plate 83, a second interlayer member 86, and a fourth vibrating plate 84 in this order from the second non-spring part 62 toward the fourth non-spring part 72. The third vibrating plate 83 and the fourth vibrating plate 84 have the same shape. The third vibrating plate 83 and the fourth vibrating plate 84 are formed of silicon. The thickness along the Z direction of the third vibrating plate 83 is the same as the thickness along the Z direction of the first vibrating plate 81. The thickness along the Z direction of the fourth vibrating plate 84 is the same as the thickness along the Z direction of the second vibrating plate 82. The second interlayer member 86 is formed of silicon. The thickness along the Z direction of the second interlayer member 86 is the same as the thickness along the Z direction of the first interlayer member 85.

The second non-spring part 62 and the fourth non-spring part 72 are each provided with two attaching holes 38 to which screws for fixing the piezoelectric actuator 30 to the fixation member 36 are inserted. The attaching holes 38 is disposed so as to penetrate the first parallel spring part 60, the third vibrating plate 83, the second interlayer member 86, the fourth vibrating plate 84, and the second parallel spring part 70.

Figure 4:
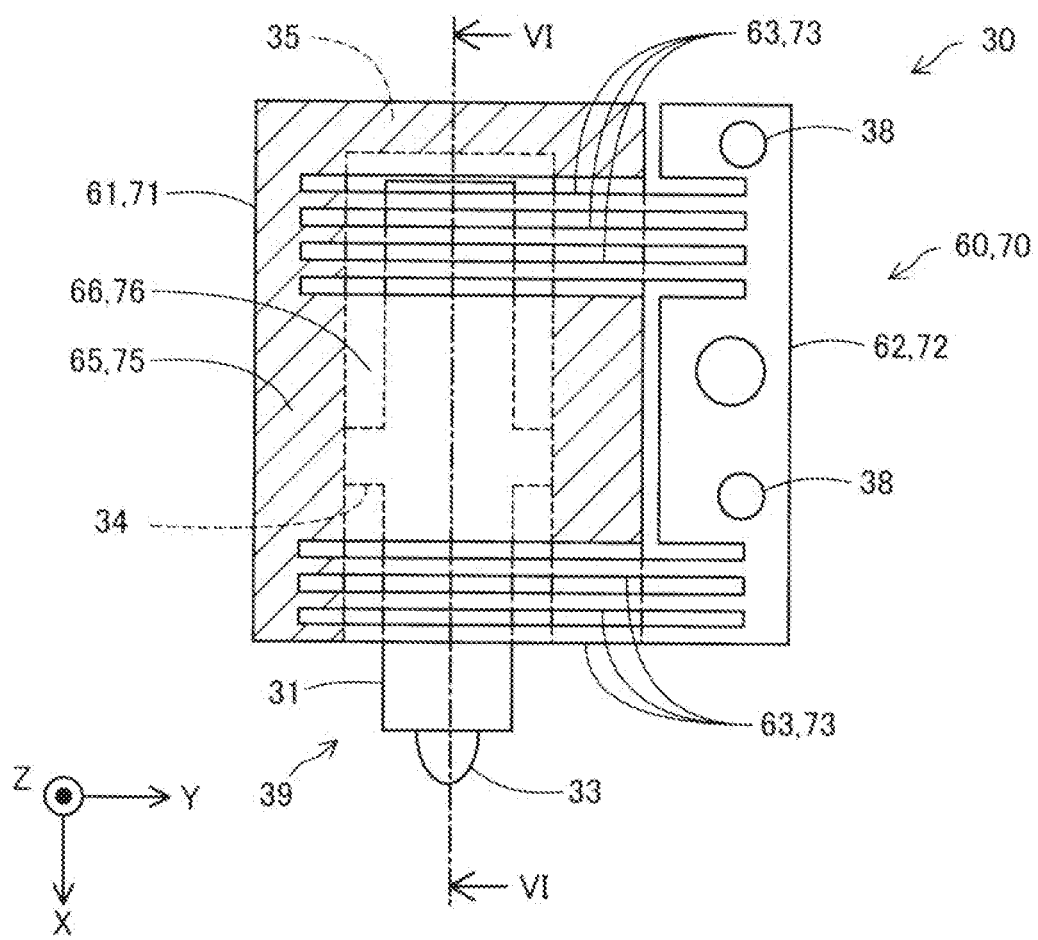
FIG. 4 is a plan view showing the configuration of the piezoelectric actuator in the first embodiment.

FIG. 4 is a plan view showing a configuration of each of the piezoelectric actuators 30. The main body part 39 has a vibrating part 31, a support part 34, and an arm part 35. The vibrating part 31 is a portion having the piezoelectric elements 32. The shape of the vibrating part 31 viewed from the first parallel spring part 60 toward the second parallel spring part 70 is a rectangular shape having a longitudinal direction along the X direction. At the center of one of the short sides of the vibrating part 31, there is coupled the tip part 33. The arm part 35 is a portion opposed to the other of the short sides of the vibrating part 31 and both long sides of the vibrating part 31. The support part 34 is a portion for coupling the centers of both of the long sides of the vibrating part 31 and the arm part 35 to each other.

The first non-spring part 61 of the first parallel spring part 60 has a first thick wall part 65 and a first thin wall part 66. The thickness along the Z direction of the first thin wall part 66 is smaller than the thickness along the Z direction of the first thick wall part 65. The first thick wall part 65 is disposed in an area opposed to the arm part 35 in the first non-spring part 61. In FIG. 4, there is provided hatching in the area where the first thick wall part 65 is disposed. The first thin wall part 66 is disposed in an area opposed to the vibrating part 31 and the support part 34 in the first non-spring part 61. The first thick wall part 65 is bonded to the arm part 35 with an adhesive having an insulation property. The first thin wall part 66 has a predetermined distance from the vibrating part 31 and the support part 34.

The third non-spring part 71 of the second parallel spring part 70 has a second thick wall part 75 and a second thin wall part 76. The thickness along the Z direction of the second thin wall part 76 is smaller than the thickness along the Z direction of the second thick wall part 75. The second thick wall part 75 is disposed in an area opposed to the arm part 35 in the third non-spring part 71. In FIG. 4, there is provided hatching in the area where the second thick wall part 75 is disposed. The second thin wall part 76 is disposed in an area opposed to the vibrating part 31 and the support part 34 in the third non-spring part 71. The second thick wall part 75 is bonded to the arm part 35 with an adhesive having an insulation property. The second thin wall part 76 has a predetermined distance from the vibrating part 31 and the support part 34.

Figure 5:
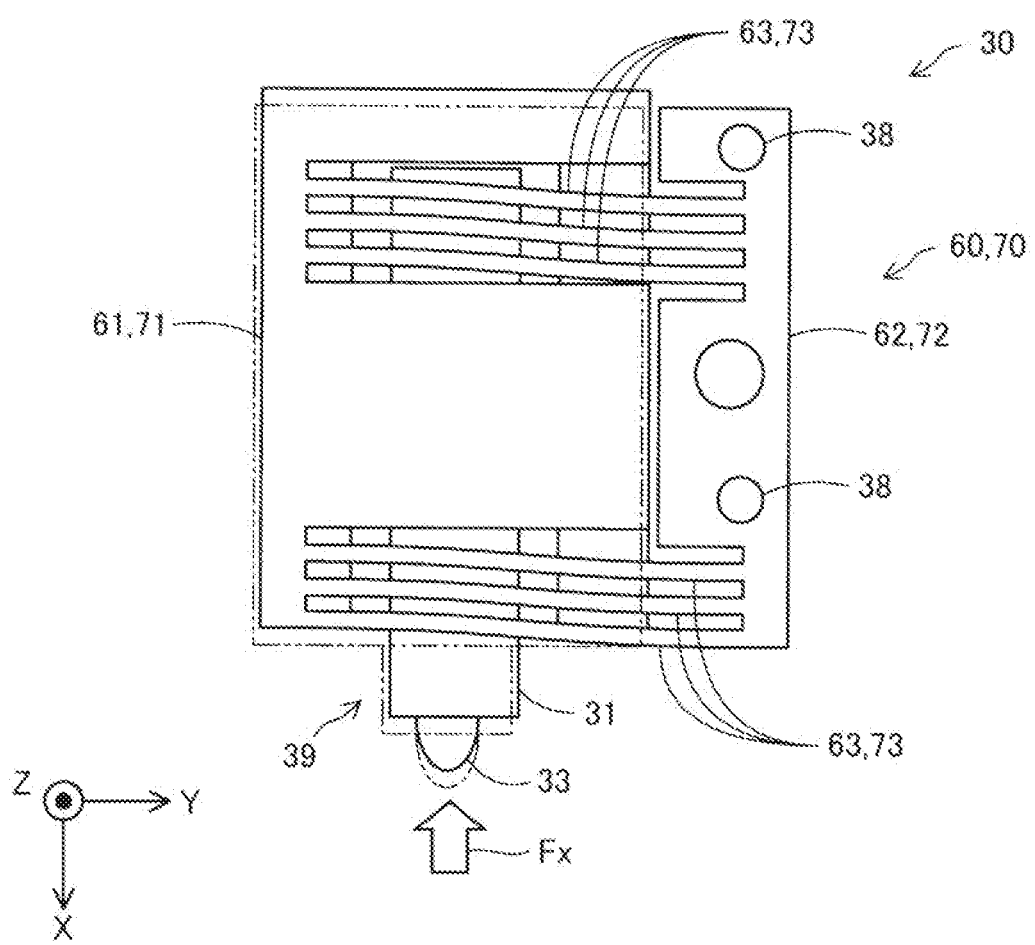
FIG. 5 is an explanatory diagram showing how a first parallel spring part and a second parallel spring part deform.

FIG. 5 is an explanatory diagram showing how the first parallel spring part 60 and the second parallel spring part 70 deform. The first parallel spring part 60 functions as a parallel spring mechanism with respect to a load along the X direction. The second parallel spring part 70 functions as a parallel spring mechanism with respect to the load along the X direction similarly to the first parallel spring part 60. For example, as shown in FIG. 5, when the load Fx is applied to the tip part 33 toward the −X direction, the first non-spring part 61 and the third non-spring part 71 are pushed toward the −X direction via the main body part 39. By the first non-spring part 61 and the third non-spring part 71 being pushed toward the −X direction, the first plate spring parts 63 warp toward the −X direction while keeping the parallel state, and the second plate spring parts 73 warp toward the −X direction while keeping the parallel state. The first non-spring part 61 does not rotate with respect to the second non-spring part 62, but is translated toward the −X direction in accordance with the amount of the deflection toward the −X direction of the first plate spring parts 63, and at the same time, translated toward the +Y direction in accordance with the shift amount toward the +Y direction of a coupling part between the first plate spring parts 63 and the first non-spring part 61 due to the deflection of the first plate spring parts 63. The third non-spring part 71 does not rotate with respect to the fourth non-spring part 72, but is translated toward the −X direction in accordance with the amount of the deflection toward the −X direction of the second plate spring parts 73, and at the same time, translated toward the +Y direction in accordance with the shift amount toward the +Y direction of a coupling part between the second plate spring parts 73 and the third non-spring part 71 due to the deflection of the second plate spring parts 73. It should be noted that in FIG. 5, the positions of the first parallel spring part 60 and the second parallel spring part 70 which have not yet moved are represented by the dashed-two dotted lines. The first non-spring part 61, the second non-spring part 62, the third non-spring part 71, and the fourth non-spring part 72 hardly deform. The second non-spring part 62 and the fourth non-spring part 72 are fixed to the fixation member 36, and therefore, do not move with respect to the fixation member 36.

Figure 6:
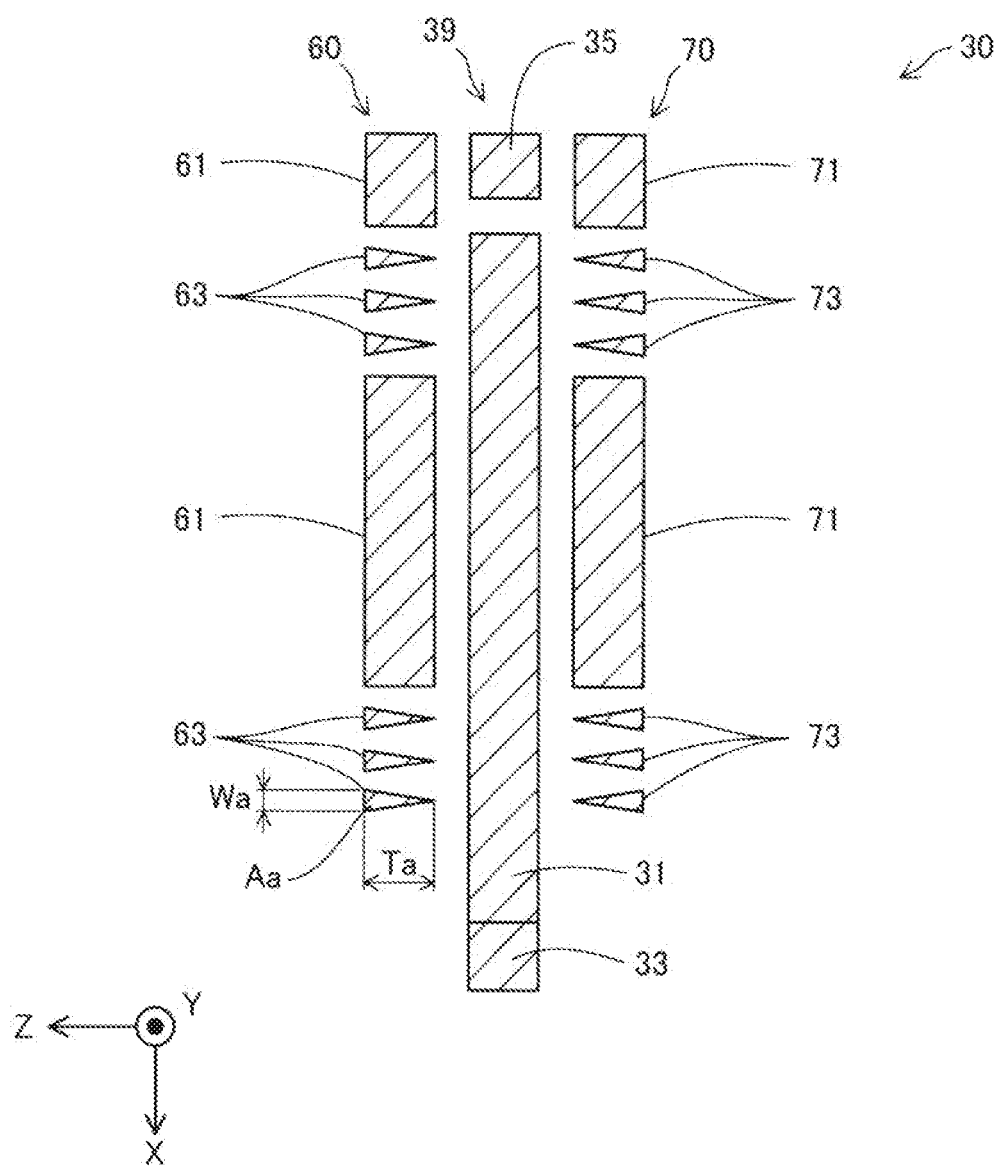
FIG. 6 is a cross-sectional view along the VI-VI line of the piezoelectric actuator in the first embodiment.

FIG. 6 is a cross-sectional view along the VI-VI line of the piezoelectric actuator 30 in FIG. 4. The first plate spring parts 63 each have a cross-sectional shape of an isosceles triangle having a vertex opposed to the main body part 39. The first plate spring parts 63 each have the cross-sectional shape uniform along the Y direction. Therefore, the first plate spring parts 63 each have a triangular prismatic shape. The second plate spring parts each have a cross-sectional shape of an isosceles triangle having a vertex opposed to the main body part 39. The second plate spring parts 73 each have the cross-sectional shape uniform along the Y direction. Therefore, the second plate spring parts 73 each have a triangular prismatic shape.

Figure 7:
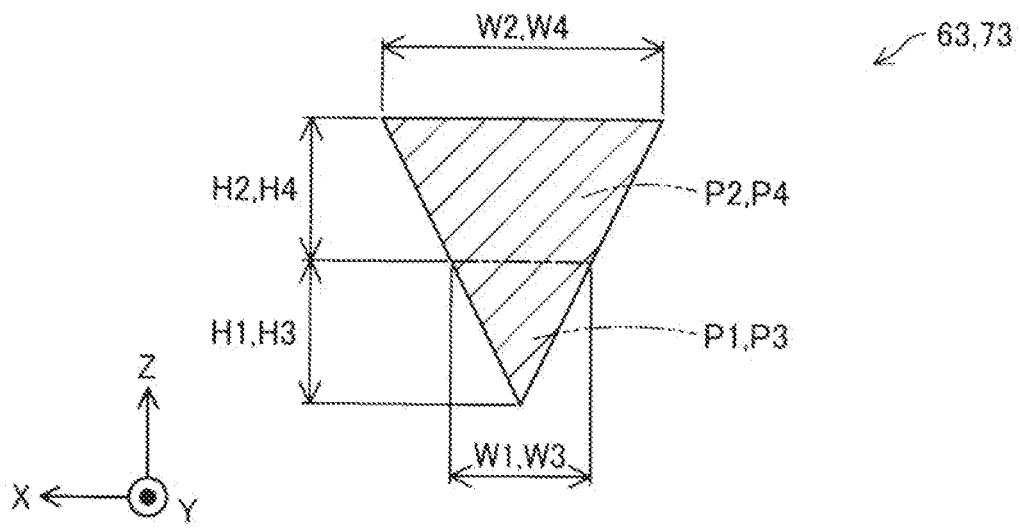
FIG. 7 is an explanatory diagram showing a cross-sectional shape of a first plate spring part in the first embodiment.

FIG. 7 is an explanatory diagram showing the cross-sectional shape of the first plate spring part 63. FIG. 7 shows the cross-sectional shape of one of the six first plate spring parts 63 in the cross-sectional surface along the VI-VI line. When virtually dividing the first plate spring part 63 into two portions so that the length along the Z direction is divided into two equal parts, the portion closer to the vibrating part 31 is referred to as a first portion P1, and the portion farther from the vibrating part 31 is referred to as a second portion P2. In FIG. 7, a boundary between the first portion P1 and the second portion P2 is represented by the dashed-two dotted line. The length W1 along the X direction of the cross-sectional surface of the first portion P1 is shorter than the length W2 along the X direction of the cross-sectional surface of the second portion P2. In the present embodiment, the first plate spring parts 63 each have the cross-sectional shape uniform along the Y direction. Therefore, the volume of the second portion P2 is larger than the volume of the first portion P1.

When virtually dividing the second plate spring part 73 into two portions so that the length along the Z direction is divided into two equal parts, the portion closer to the vibrating part 31 is referred to as a third portion P3, and the portion farther from the vibrating part 31 is referred to as a fourth portion P4. The length W3 along the X direction of the cross-sectional surface of the third portion P3 is shorter than the length W4 along the X direction of the cross-sectional surface of the fourth portion P4. In the present embodiment, the second plate spring parts 73 each have the cross-sectional shape uniform along the Y direction. Therefore, the volume of the fourth portion P4 is larger than the volume of the third portion P3.

Figure 8:
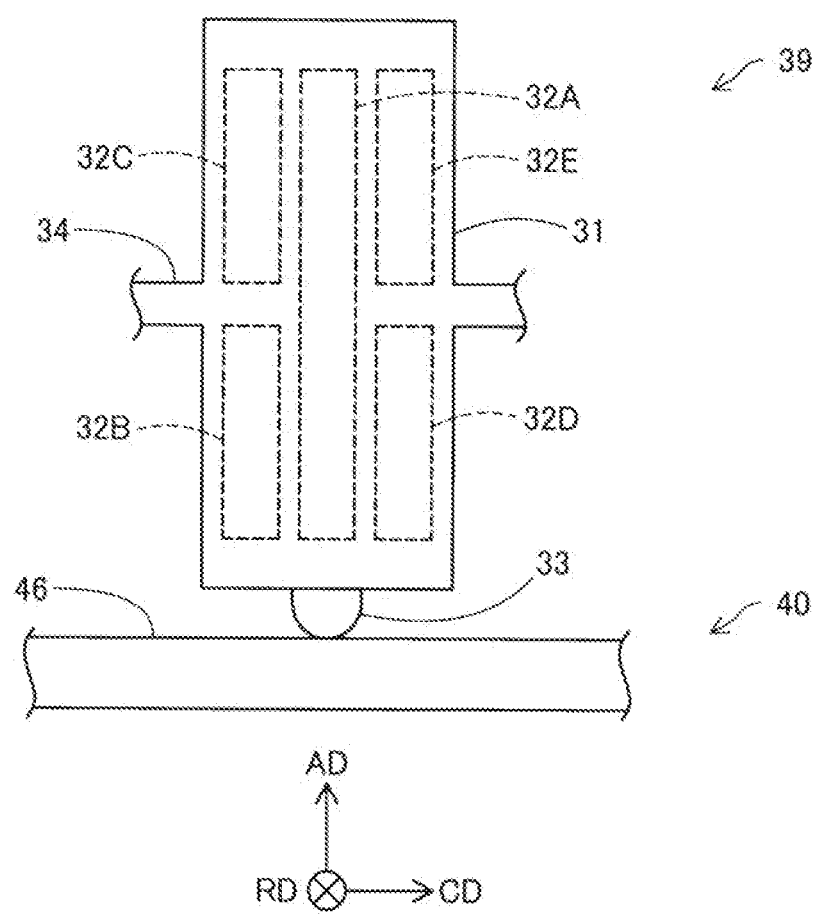
FIG. 8 is an explanatory diagram showing a configuration of a vibrating part in the first embodiment.

FIG. 8 is an explanatory diagram showing a configuration of the vibrating part 31. In the present embodiment, the vibrating part 31 has a first piezoelectric element 32A, a second piezoelectric element 32B, a third piezoelectric element 32C, a fourth piezoelectric element 32D, and a fifth piezoelectric element 32E. Each of the piezoelectric elements 32A through 32E is disposed along the longitudinal direction of the vibrating part 31. In FIG. 8, the first piezoelectric element 32A is disposed at the center of the vibrating part 31. The second piezoelectric element 32B and the third piezoelectric element 32C are disposed on the left side of the first piezoelectric element 32A. The second piezoelectric element 32B is disposed on the lower side of the support part 34. The third piezoelectric element 32C is disposed on the upper side of the support part 34. The fourth piezoelectric element 32D and the fifth piezoelectric element 32E are disposed on the right side of the first piezoelectric element 32A. The fourth piezoelectric element 32D is disposed on the lower side of the support part 34. The fifth piezoelectric element 32E is disposed on the upper side of the support part 34.

Figure 9:
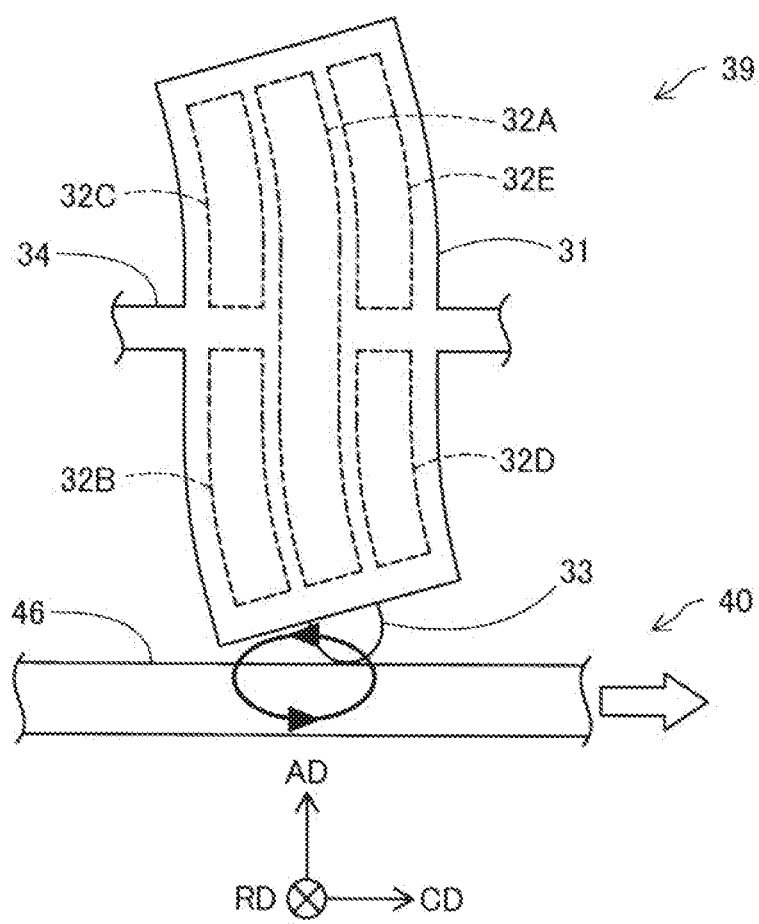
FIG. 9 is an explanatory diagram showing an operation of the vibrating part in the first embodiment.

FIG. 9 is an explanatory diagram showing an operation of the vibrating part 31. It is possible to make the tip part 33 perform an elliptical motion by making a phase of an AC current supplied to the second piezoelectric element 32B and the fifth piezoelectric element 32E and a phase of an AC current supplied to the third piezoelectric element 32C and the fourth piezoelectric element 32D differ as much as 180 degrees from each other, and making a phase of an AC current supplied to the first piezoelectric element 32A and the phase of the AC current supplied to the second piezoelectric element 32B and the fifth piezoelectric element 32E differ from each other to thereby two-dimensionally deform the vibrating part 31. On this occasion, the vibrating part 31 deforms with the coupling portion with the support part 34 as a node. By the tip part 33 repeating the elliptical motion, the tip part 33 and the contacted surface 46 of the rotor 40 repeatedly make contact with each other. When the tip part 33 and the contacted surface 46 make contact with each other, the tip part 33 transmits the drive force along the circumferential direction CD to the rotor 40. Therefore, during a period in which the tip part 33 repeats the elliptical motion, the rotor 40 rotates around the rotational axis RX. In the present embodiment, since the tip part 33 is biased toward the contacted surface 46 when the tip part 33 and the contacted surface 46 make contact with each other, it is possible for the tip part 33 to efficiently transmit the drive force along the circumferential direction CD to the rotor 40. It should be noted that it is possible to rotate the rotor 40 in an opposite direction by making a 180-degree turn of the AC current to be supplied to each of the piezoelectric elements 32A through 32E described above.

Figure 10:
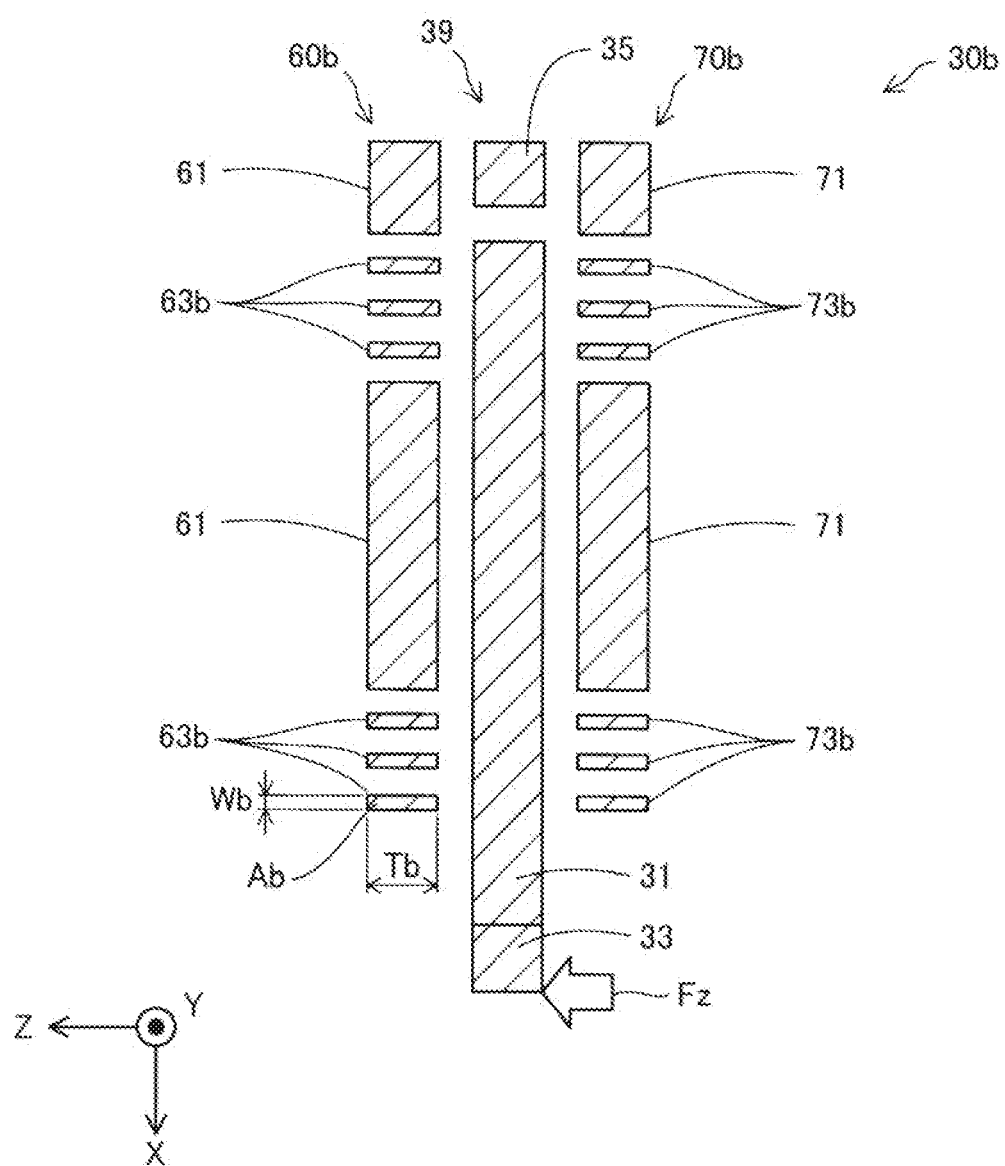
FIG. 10 is a cross-sectional view of a piezoelectric actuator in a comparative example.

FIG. 10 is a cross-sectional view showing a configuration of a piezoelectric actuator 30b in a comparative example. As shown in FIG. 6, in the piezoelectric actuators 30 in the present embodiment, the cross-sectional shape perpendicular to the Y direction of each of the first plate spring parts 63, and the cross-sectional shape perpendicular to the Y direction of each of the second plate spring parts 73 are each a isosceles triangle having the vertex opposed to the main body part 39. In contrast, the piezoelectric actuator 30b in the comparative example is different from the present embodiment in the point that the cross-sectional shape perpendicular to the Y direction of each of first plate spring parts 63b, and the cross-sectional shape perpendicular to the Y direction of each of second plate spring parts 73b are each a rectangular shape. The rest of the configurations of the piezoelectric actuator 30b are the same as those of the piezoelectric actuator 30 in the present embodiment. The thickness Tb along the Z direction of the first plate spring part 63b in the comparative example and the thickness Ta along the Z direction of the first plate spring part 63 in the present embodiment are the same. The width Wb along the X direction of the first plate spring part 63b in the comparative example and an average value Wave=Wa/2 of the width along the X direction of the first plate spring part in the present embodiment are the same. The cross-sectional area Ab of the first plate spring part 63b in the comparative example is the same as the cross-sectional area Aa of the first plate spring part 63 in the present embodiment. The second plate spring part 73 in the present embodiment has a symmetrical shape with the first plate spring part 63 across the main body part 39. The second plate spring part 73b in the comparative example has a symmetrical shape with the first plate spring part 63b across the main body part 39. For example, when a load Fz along the Z direction is applied to the tip part 33, in the first plate spring part 63b and the second plate spring part 73b, there occurs a deflection toward the Z direction or a contortion centering on an axis parallel to the Y direction. In the first plate spring part 63 in the present embodiment, the second moment of area with respect to an axis parallel to the X direction is higher, and at the same time, the second moment of area with respect to an axis parallel to the Z direction is equivalent compared to the first plate spring part 63b in the comparative example. In the first plate spring part 63 in the present embodiment, the second moment of area is higher compared to the first plate spring part 63b in the comparative example. Therefore, when the load Fz along the Z direction is applied to the tip part 33, the deflection toward the Z direction and the contortion centering on an axis parallel to the Y direction are smaller in the first plate spring part 63 in the present embodiment than in the first plate spring part 63b in the comparative example.

According to the piezoelectric motor 10 in the present embodiment described hereinabove, it is possible to make the first plate spring parts 63 and the second plate spring parts 73 hard to warp in the Z direction, and at the same time, make the first plate spring parts 63 and the second plate spring parts 73 hard to be contorted centering on an axis parallel to the Y direction while keeping the flexibility in the X direction of the first plate spring parts 63 and the second plate spring parts 73. Therefore, it is possible to prevent the position of the rip part 33 of the piezoelectric actuator 30 from being shifted along the Z direction with respect to the contacted surface 46 of the rotor 40, and the tip part 33 from being tilted centering on an axis parallel to the Y direction. Therefore, it is possible to efficiently and stably transmit the drive force from the piezoelectric actuator 30 to the rotor 40. It should be noted that in the piezoelectric motor 10 in the present embodiment, since it is possible to prevent the tip part 33 from being tilted with respect to the contacted surface 46 of the rotor 40, it is possible to prevent the abrasion from unevenly occurring in a part of the tip part 33.

B. Second Embodiment

Figure 11:
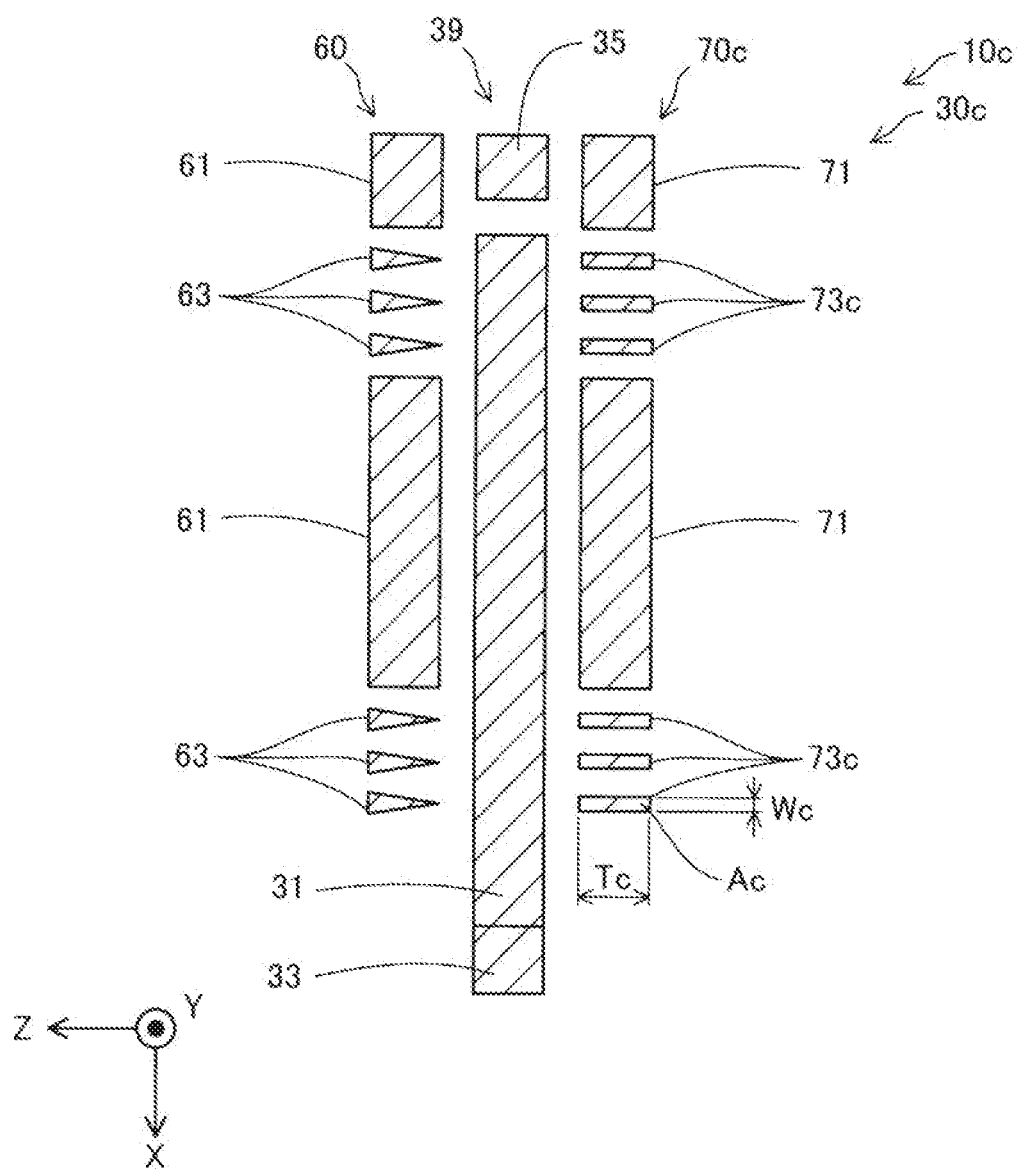
FIG. 11 is a cross-sectional view of a piezoelectric actuator in a second embodiment.

FIG. 11 is a cross-sectional view showing a configuration of a piezoelectric actuator 30c in a second embodiment. In the piezoelectric motor 10c in the second embodiment, the cross-sectional shape of second plate spring parts 73c of a second parallel spring part 70c in the piezoelectric actuator 30c is different from that in the first embodiment. The other configurations are the same as those in the first embodiment shown in FIG. 1 through FIG. 9 unless particularly described.

In the present embodiment, the first parallel spring part 60 and the second parallel spring part 70c have asymmetrical shapes across the main body part 39. The cross-sectional shape of each of the first plate spring parts 63 is the same as in the first embodiment. The cross-sectional shape of each of the second plate spring parts 73c is a rectangular shape. The second plate spring parts 73c each have a cross-sectional shape uniform along the Y direction. The thickness Tc along the Z direction of the second plate spring part 73c is the same as the thickness Ta along the Z direction of the second plate spring part 73 in the first embodiment. The width Wc along the Z direction of the second plate spring part 73c is a half as large as the width Wa along the Z direction of the second plate spring part 73 in the first embodiment. The cross-sectional area Ac of the second plate spring part 73c is the same as the cross-sectional area Aa of the second plate spring part 73 in the first embodiment.

According to the piezoelectric motor 10c in the present embodiment described hereinabove, it is possible to make the first plate spring parts 63 and the second plate spring parts 73c hard to warp in the Z direction, and at the same time, make the first plate spring parts 63 and the second plate spring parts 73c hard to be contorted centering on an axis parallel to the Y direction while keeping the flexibility in the X direction of the first plate spring parts 63 and the second plate spring parts 73c. It should be noted that it is possible to adopt a configuration in which the rectangular cross-sectional surface is provided to the first plate spring part 63 of the first parallel spring part 60 instead of the second plate spring part 73c of the second parallel spring part 70c.

C. Third Embodiment

Figure 12:
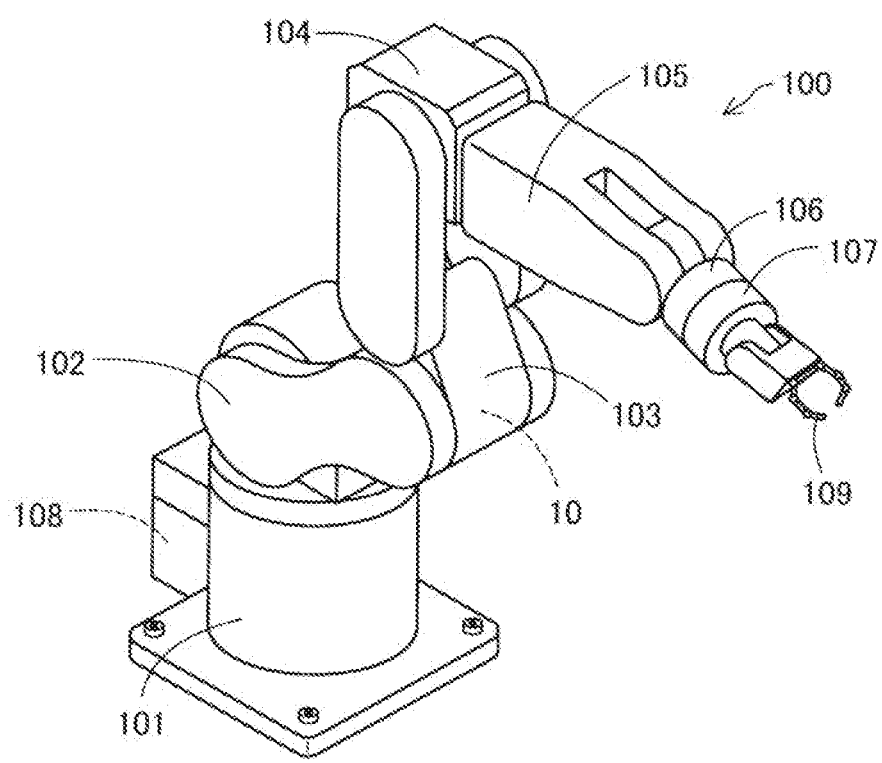
FIG. 12 is an explanatory diagram showing a schematic configuration of a robot according to a third embodiment.

FIG. 12 is a perspective view showing a schematic configuration of a robot 100 according to a third embodiment. The robot 100 according to the present embodiment is capable of performing operations such as feed, removal, transmission, and assembling of precision mechanical equipment or a component constituting the precision mechanical equipment. The robot 100 is a six-axis robot, and is provided with a base 101 to be fixed to the floor or the ceiling, a first arm 102 rotatably coupled to the base 101, a second arm 103 rotatably coupled to the first arm 102, a third arm 104 rotatably coupled to the second arm 103, a fourth arm 105 rotatably coupled to the third arm 104, a fifth arm 106 rotatably coupled to the fourth arm 105, a sixth arm 107 rotatably coupled to the fifth arm 106, and a robot control section 108 for controlling drive of each of the arms 102, 103, 104, 105, 106, and 107. The sixth arm 107 is provided with a hand coupling section, and to the hand coupling section, there is attached an end effector 109 corresponding to an operation to be performed by the robot 100. The piezoelectric motor 10 described in the first embodiment is installed in all or some of the joint sections, and due to the drive of the piezoelectric motor 10, each of the arms 102, 103, 104, 105, 106, and 107 rotates. The drive of each of the piezoelectric motors 10 is controlled by the robot control section 108.

The robot control section 108 is formed of a computer provided with at least one processor, a main storage device, and an input/output interface for performing input/output of a signal with the outside. In the present embodiment, the robot control section 108 controls the operation of the robot 100 by the processor executing a program or instructions retrieved on the main storage device. It should be noted that it is also possible for the robot control section 108 to be formed of a combination of a plurality of circuits instead of the computer.

According to the robot 100 in the present embodiment described hereinabove, since the piezoelectric motor 10 described in the first embodiment is used in the joint part, it is possible to efficiently and stably supply the drive force for driving each of the arms 102, 103, 104, 105, 106, and 107.

It should be noted that it is possible for the robot 100 to be provided with the piezoelectric motor 10c described in the second embodiment.

D. Fourth Embodiment

Figure 13:
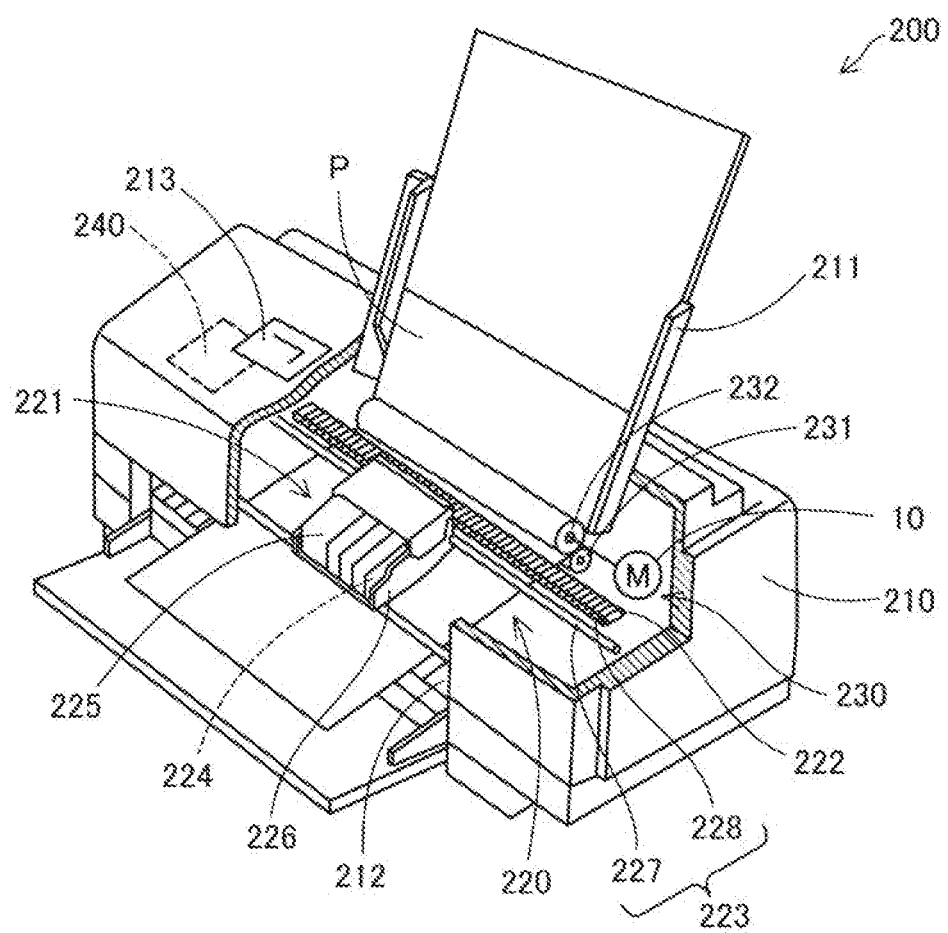
FIG. 13 is an explanatory diagram showing a schematic configuration of a printer according to a fourth embodiment.

FIG. 13 is an explanatory diagram showing a printer 200. The printer 200 in the present embodiment is provided with a device main body 210, a printing mechanism 220, a paper-feed mechanism 230, and a control section 240, wherein the printing mechanism 220, the paper-feed mechanism 230, and the control section 240 are disposed inside the device main body 210.

The device main body 210 is provided with a tray 211 for installing recording sheets P, a paper ejection port 212 for ejecting the recording sheets P, and an operation panel 213 such as a liquid crystal display.

The printing mechanism 220 is provided with a head unit 221, a carriage motor 222, and a reciprocation mechanism 223 for reciprocating the head unit 221 due to the drive force of the carriage motor 222.

The head unit 221 has a head 224 as an inkjet recording head, an ink cartridge 225 for supplying the head 224 with ink, and a carriage 226 on which the head 224 and the ink cartridge 225 are mounted.

The reciprocation mechanism 223 has a carriage guide shaft 227 supporting the carriage 226 so as to be able to reciprocate, and a timing belt 228 for moving the carriage 226 on the carriage guide shaft 227 due to the drive force of the carriage motor 222.

The paper-feed mechanism 230 has a driven roller 231 and a drive roller 232 having pressure contact with each other, and the piezoelectric motor 10 described in the first embodiment. The piezoelectric motor 10 is used as the paper-feed motor for driving the drive roller 232. It should be noted that it is possible to use the piezoelectric motor 10 as the carriage motor 222 described above.

The control section 240 controls the printing mechanism 220, the paper-feed mechanism 230, and so on based on the print data input from a host computer such as a personal computer.

In the printer 200, the paper-feed mechanism 230 intermittently feeds the recording sheet P to the vicinity of a lower part of the head unit 221 one by one. On this occasion, the head unit 221 reciprocates in a direction substantially perpendicular to the feeding direction of the recording sheet P to perform printing on the recording sheet P.

According to the printer 200 in the present embodiment described hereinabove, since the piezoelectric motor 10 described in the first embodiment is used as the paper-feed motor for driving the drive roller 232, it is possible to efficiently and stably supply the drive force for driving the drive roller 232. It should be noted that it is possible for the printer 200 to be provided with the piezoelectric motor 10c described in the second embodiment.

Figure 14:
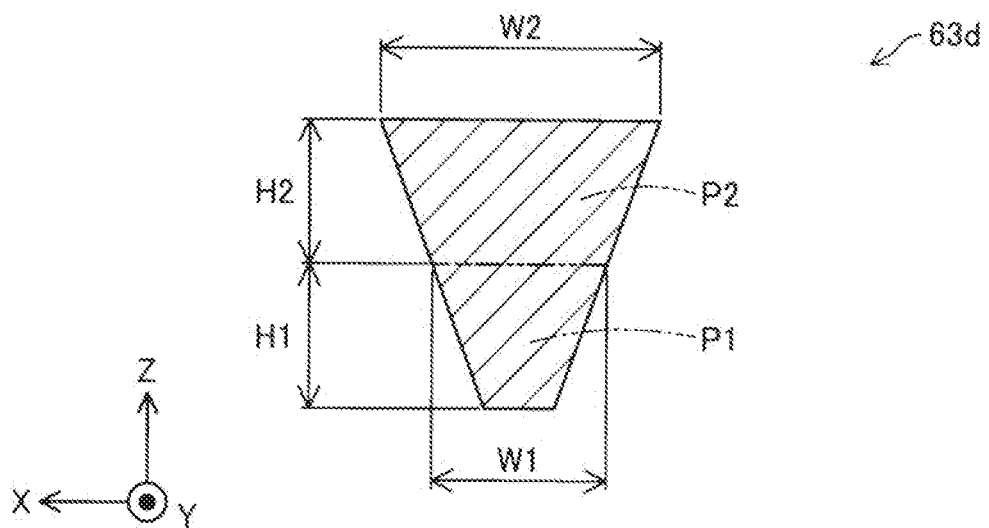
FIG. 14 is a first explanatory diagram showing a cross-sectional shape of a first plate spring part in another embodiment.
Figure 15:
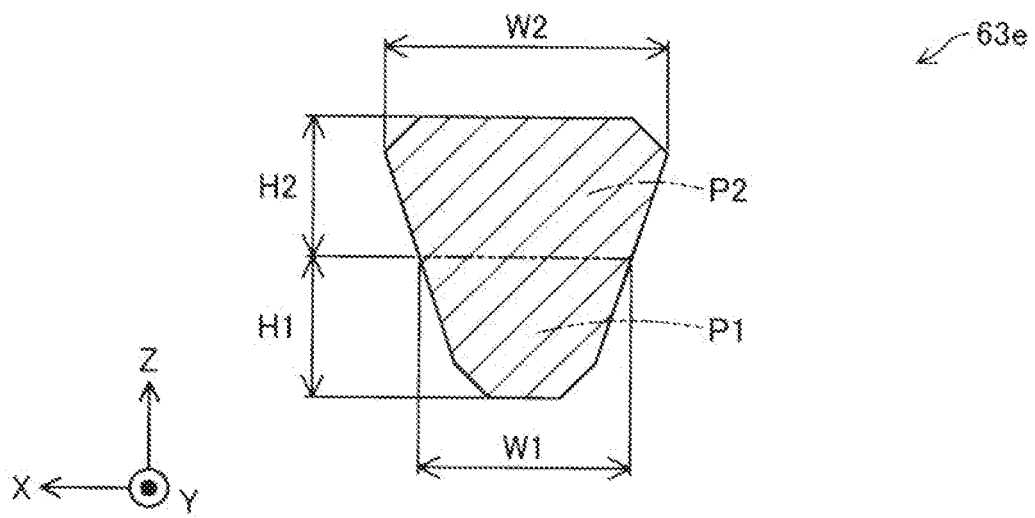
FIG. 15 is a second explanatory diagram showing a cross-sectional shape of a first plate spring part in another embodiment.
Figure 16:
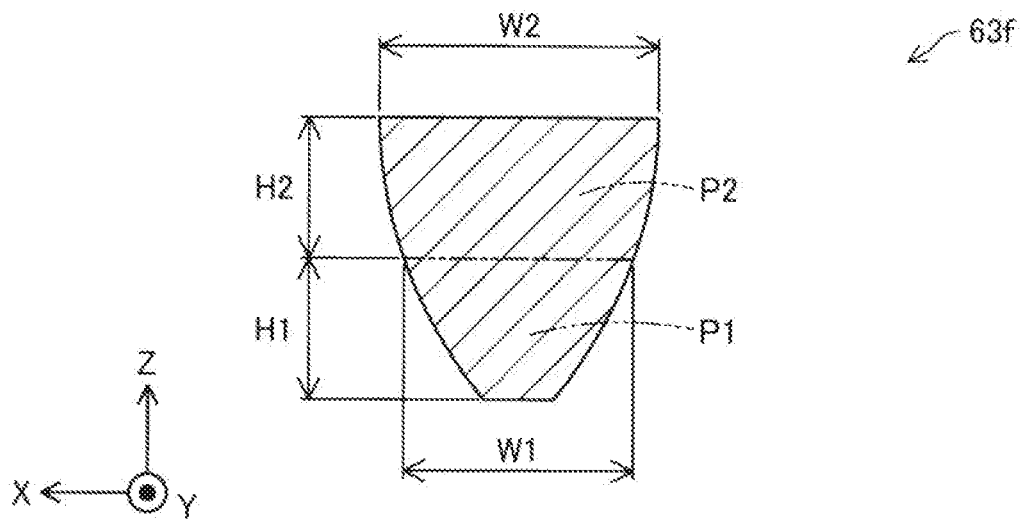
FIG. 16 is a third explanatory diagram showing a cross-sectional shape of a first plate spring part in another embodiment.
Figure 17:
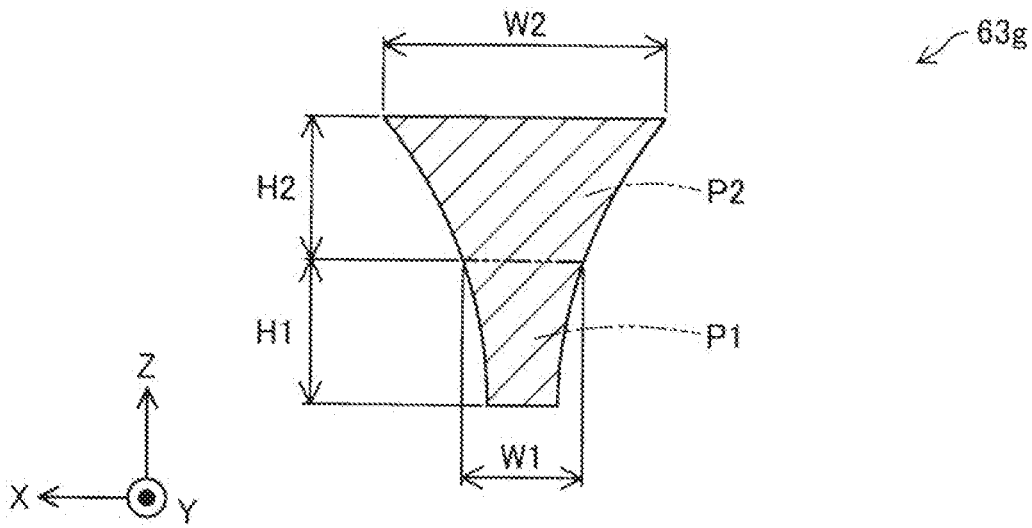
FIG. 17 is a fourth explanatory diagram showing a cross-sectional shape of a first plate spring part in another embodiment.
Figure 18:
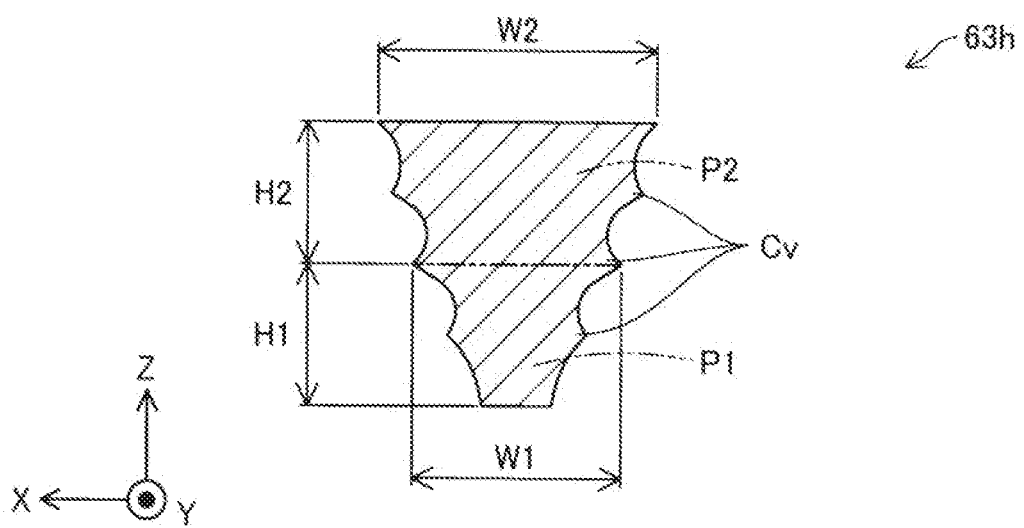
FIG. 18 is a fifth explanatory diagram showing a cross-sectional shape of a first plate spring part in another embodiment.

E. Other Embodiments (E1) FIG. 14 through FIG. 18 are explanatory diagrams showing cross-sectional shapes of first plate spring parts 63d, 63e, 63f, 63g, and 63h in other embodiments, respectively. In FIG. 14 through FIG. 18, there are shown the cross-sectional shapes of the first plate spring parts 63d, 63e, 63f, 63g, and 63h perpendicular to the Y direction, respectively. As shown in FIG. 14, it is possible for the first plate spring part 63d to have a trapezoidal cross-sectional shape. As shown in FIG. 15, it is possible for the first plate spring part 63e to have a cross-sectional shape obtained by chamfering the corners of the trapezoidal shape. As shown in FIG. 16, it is possible for the first plate spring part 63f to have a cross-sectional shape in which the contour lines crossing in the X direction are convexed outside. As shown in FIG. 17, it is possible for the first plate spring part 63g to have a cross-sectional shape in which the contour lines crossing in the X direction are concaved inside. As shown in FIG. 18, it is possible for the first plate spring part 63h to have a cross-sectional shape in which the contour lines crossing in the X direction are each constituted by circular arcs sequentially coupled to one another to have protruding parts Cv protruding outward. It is possible for the first plate spring part 63h to have the protruding part Cv on the surface opposed to the main body part 39, or to have the protruding part Cv on a surface on the opposite side to the main body part 39. In this case, since it is possible to further increase the surface area of the first plate spring part 63h due to the protruding part Cv, it is possible to make it easy to release the heat of the main body part 39 via the first plate spring part 63h.

(E2) In the piezoelectric motors 10, 10c in the respective embodiments described above, both of the first parallel spring part 60 and the second parallel spring part 70, 70c bias the main body part 39 toward the rotor 40. In contrast, either one of the first parallel spring part 60 and the second parallel spring part 70, 70c is not required to bias the main body part 39 toward the rotor 40. For example, the second parallel spring part 70, 70c is not required to be coupled to the main body part 39 to bias the main body part 39 toward the rotor 40. In this case, when the main body part 39 moves in the −Z direction to make contact with the second parallel spring part 70, 70c due to the deflection or the contortion of the first parallel spring part 60, the second parallel spring part 70, 70c can support the main body part 39. Therefore, it is possible to suppress the position shift toward the −Z direction of the main body part 39.

(E3) in the piezoelectric motors 10, 10c in the respective embodiment described above, the length W1 along the X direction of the cross-sectional surface of the first portion P1 of the first plate spring part 63 is shorter than the length W2 along the X direction of the cross-sectional surface of the second portion P2, and at the same time, the length W3 along the X direction of the cross-sectional surface of the third portion P3 of the second plate sparing part 73, 73c is shorter than the length W4 along the X direction of the cross-sectional surface of the fourth portion P4. In contrast, the length W1 along the X direction of the cross-sectional surface of the first portion P1 of the first plate spring part 63 can be equal to or longer than the length W2 along the X direction of the cross-sectional surface of the second portion P2 providing there is adopted a configuration capable of making it hard to warp in the Z direction and making it hard to be contorted centering on an axis parallel to the Y direction while keeping the flexibility in the X direction. The length W3 along the X direction of the cross-sectional surface of the third portion P3 of the second plate spring part 73, 73c can be equal to or longer than the length W4 along the X direction of the cross-sectional surface of the fourth portion P4 providing there is adopted a configuration capable of making it hard to warp in the Z direction and making it hard to be contorted centering on an axis parallel to the Y direction while keeping the flexibility in the X direction.

(E4) In the piezoelectric motors 10, 10c in the respective embodiments described above, the first parallel spring part 60 is provided with the plurality of first plate spring parts 63, and the second parallel spring part 70, 70c is provided with the plurality of second plate spring parts 73, 73c. In contrast, the number of the first plate spring parts 63 provided to the first parallel spring part 60 can be one instead of the plural number. The number of the second plate spring part 73, 73c provided to the second parallel spring part 70, 70c can be one instead of the plural number.

(E5) In the piezoelectric motors 10, 10c in the respective embodiments described above, the rotor 40 is made to perform the rotational motion using the piezoelectric actuators 30, 30c. In contrast, it is possible to provide the piezoelectric motors 10, 10c with a configuration of making a slider perform a translational motion using the piezoelectric actuators 30, 30c.

F. Other Aspects

The present disclosure is not limited to the embodiments described above, but can be implemented in a variety of aspects within the scope or the spirit of the present disclosure. For example, the present disclosure can also be implemented in the following aspects. The technical features in each of the embodiments described above corresponding to the technical features in each of the aspects described below can arbitrarily be replaced or combined in order to solve a part or the whole of the problem of the present disclosure, or to achieve some or all of the advantages of the present disclosure. Further, the technical feature can arbitrarily be eliminated unless described in the present specification as an essential element.

(1) According to an aspect of the present disclosure, there is provided a piezoelectric drive device. The piezoelectric drive device includes a vibrating part which has a piezoelectric element, and drives a driven part using the piezoelectric element, and a first plate spring part configured to bias the vibrating part in a first direction from the vibrating part toward the driven part. The first plate spring part extends toward a second direction crossing the first direction, the first plate spring part is disposed so as to be opposed to the vibrating part in a third direction perpendicular to the first direction and the second direction, and when dividing the first plate spring part into a first portion and a second portion farther from the vibrating part than the first portion so that a length along the third direction is equally divided, a volume of the second portion is larger than a volume of the first portion.

According to the piezoelectric drive device of this aspect, it is possible to prevent the first plate spring part for biasing the vibrating part from warping in the third direction. Therefore, it is possible to prevent the position of the vibrating body from being shifted in the third direction.

(2) In the piezoelectric drive device according to the above aspect, a length along the first direction of the first portion may be shorter than a length along the first direction of the second portion.

According to the piezoelectric drive device of this aspect, it is possible to more surely prevent the first plate spring part from warping in the third direction.

(3) In the piezoelectric drive device according to the above aspect, the first plate spring part may have a protruding part.

According to the piezoelectric drive device of this aspect, since it is possible to further increase the surface area of the first plate spring part, it is possible to make it easy to release the heat of the vibrating part via the first plate spring part.

(4) In the piezoelectric drive device according to the above aspect, the protruding part may be provided to a surface along the second direction in the first plate spring part.

According to the piezoelectric drive device of this aspect, since it is possible to further increase the surface area of the first plate spring part, it is possible to make it easy to release the heat of the vibrating part via the first plate spring part.

(5) In the piezoelectric drive device according to the above aspect, there may further be included a second plate spring part configured to bias the vibrating part in the first direction together with the first plate spring part, wherein the second plate spring part may extend toward the second direction, the second plate spring part may be disposed so as to be opposed to the vibrating part in the third direction, the vibrating part may be disposed between the first plate spring part and the second plate spring part, and when dividing the second plate spring part into a third portion and a fourth portion farther from the vibrating part than the third portion so that a length along the third direction is equally divided, a volume of the fourth portion may be larger than a volume of the third portion.

According to the piezoelectric drive device of this aspect, it is possible to prevent the first plate spring part and the second plate spring part for biasing the vibrating part from warping in the third direction, and at the same time, prevent the first plate spring part and the second plate spring part from being contorted centering on an axis parallel to the second direction. Therefore, it is possible to more surely prevent the position of the vibrating body from being shifted in the third direction.

The present disclosure can be implemented in a variety of aspects other than the piezoelectric drive device. For example, the present disclosure can also be implemented as aspects such as a piezoelectric motor, a robot, and a printer.

What is claimed is:

1. A piezoelectric drive device comprising:
    a vibrating part which has a piezoelectric element, and drives a driven part using the piezoelectric element; and
    a first plate spring part configured to bias the vibrating part in a first direction from the vibrating part toward the driven part, wherein
    the first plate spring part extends toward a second direction crossing the first direction,
    the first plate spring part is disposed so as to be opposed to the vibrating part in a third direction perpendicular to the first direction and the second direction, and
    when dividing the first plate spring part into a first portion and a second portion farther from the vibrating part than the first portion so that a length along the third direction is equally divided, a volume of the second portion is larger than a volume of the first portion.

2. The piezoelectric drive device according to claim 1, wherein
    a length along the first direction of the first portion is shorter than a length along the first direction of the second portion.

3. The piezoelectric drive device according to claim 1, wherein
    the first plate spring part has a protruding part.

4. The piezoelectric drive device according to claim 3, wherein
    the protruding part is provided to a surface along the second direction in the first plate spring part.

5. The piezoelectric drive device according to claim 1, further comprising:
    a second plate spring part configured to bias the vibrating part in the first direction together with the first plate spring part, wherein
    the second plate spring part extends toward the second direction,
    the second plate spring part is disposed so as to be opposed to the vibrating part in the third direction,
    the vibrating part is disposed between the first plate spring part and the second plate spring part, and
    when dividing the second plate spring part into a third portion and a fourth portion farther from the vibrating part than the third portion so that a length along the third direction is equally divided, a volume of the fourth portion is larger than a volume of the third portion.

6. A robot comprising:
    a first arm;
    a second arm which rotates with respect to the first arm; and
    the piezoelectric drive device according to claim 1 configured to drive the second arm.

* * * * *